(12) United States Patent
Merkl (10) Patent No.: US 8,335,658 B2
(45) Date of Patent: Dec. 18, 2012

(54) METHOD AND APPARATUS FOR DETERMINING MEASUREMENT VALUES

(75) Inventor: Christoph Merkl, Staig (DE)

(73) Assignee: Mattson Technology, Inc., Fremont, CA (US)

( * ) Notice: Subject to any disclaimer, the term of this patent is extended or adjusted under 35 U.S.C. 154(b) by 643 days.

(21) Appl. No.: 12/376,231

(22) PCT Filed: Aug. 3, 2007

(86) PCT No.: PCT/IB2007/053077
§ 371 (c)(1),
(2), (4) Date: Jan. 8, 2010

(87) PCT Pub. No.: WO2008/015658
PCT Pub. Date: Feb. 7, 2008

(65) Prior Publication Data
US 2011/0125443 A1    May 26, 2011

(30) Foreign Application Priority Data
Aug. 4, 2006   (DE) .......................... 10 2006 036 585

(51) Int. Cl.
*G01K 17/00* (2006.01)
(52) U.S. Cl. .................................................... 702/136
(58) Field of Classification Search .................. None
See application file for complete search history.

(56) References Cited

U.S. PATENT DOCUMENTS

| | | | |
|---|---|---|---|
| 5,359,693 A | 10/1994 | Nenyei et al. | |
| 5,580,830 A | 12/1996 | Nenyei et al. | |
| 6,191,392 B1 | 2/2001 | Hauf et al. | |
| 6,373,033 B1 * | 4/2002 | de Waard et al. | 219/497 |
| 6,396,363 B1 | 5/2002 | Alexanian et al. | |
| 6,596,973 B1 | 7/2003 | James et al. | |
| 7,412,299 B2 * | 8/2008 | Hauf et al. | 700/121 |

FOREIGN PATENT DOCUMENTS
WO    WO 9711340 A    3/1997
WO    WO 2004059271    7/2004

* cited by examiner

*Primary Examiner* — Aditya Bhat
(74) *Attorney, Agent, or Firm* — Dority & Manning, P.A.

(57) ABSTRACT

The present invention describes a method for determining a value for the temperature, radiation, emissivity, transmissivity and/or reflectivity of an object (2) such as a semiconductor wafer in a rapid heating system (1), wherein an output signal from a radiation detector (50) which records temperature radiation from the object is used as a measurement value, and wherein prediction values for the measurement values are calculated in a model system (100). The development over time of the measurement values is compared with the development over time of the prediction values and the measurement value is corrected if the difference exceeds predetermined threshold value.

36 Claims, 5 Drawing Sheets

METHOD AND APPARATUS FOR DETERMINING MEASUREMENT VALUES

PRIORITY CLAIM

The present application claims filing benefit of German patent application Serial No. 10 2006 036 585.2 filed on Aug. 4, 2006.

FIELD OF THE INVENTION

The present invention relates to a method and an apparatus for determining measurement values which relate to at least one parameter of an object in a rapid heating system. This invention relates in particular to determining temperature or radiation measurement values for objects during a thermal treatment cycle of these objects in a processing chamber of a rapid heating system.

BACKGROUND OF THE INVENTION

Rapid heating systems, also called RTP systems, RTP installations or rapid heating installations, are widely known in the production of semiconductors, and are described, for example, in U.S. Pat. No. 5,359,693 or U.S. Pat. No. 5,580,830. They are used for the thermal treatment of substrates, in particular disc shaped substrates, such as for example semiconductor wafers. Rapid heating systems are a fixed component part of many semiconductor production lines. In order to obtain the desired process results they must heat a wafer to be treated according to a pre-specified temperature/time curve, keep the semiconductor substrate at a specific temperature for a pre-specified period of time, and finally cool the substrate down again, also mostly according to a pre-specified temperature/time curve. During these processes it is particularly significant that the temperature of the semiconductor wafer corresponds as precisely as possible to the respectively pre-specified temperature, and this temperature is as homogenous as possible over the wafer. As well as the requirements with regard to temperature precision, the dynamics of the heating processes are also very important because meanwhile, many industrial semiconductor production methods require rapid heating and cooling cycles. The active elements of a rapid heating system must therefore have sufficiently short reaction times. For this reason, with rapid heating systems lamps (halogen lamps or arc lamps) or also lasers are used in most cases as heating elements because on the one hand they can be controlled precisely, and on the other hand allow very rapid heating cycles.

As a consequence of the rapid thermal processes, a temperature measurement in the processing chambers of rapid heating systems must also be implemented very quickly during a thermal process in order to guarantee that pre-specified temperatures are maintained, and if necessary to adapt the control of the heating elements. Furthermore, it is important here that the temperature measurement does not have a negative impact upon the thermal treatment of the wafer itself. Therefore, in many cases only contact-free, in particular pyrometric temperature measurement systems are considered. Thermal elements react too sluggishly and so are mainly used for calibration processes for pyrometric temperature measurement systems.

Contact-free temperature measurement systems establish the temperature for example by measuring radiation emitted from the object (self radiation), the temperature of which is to be determined, directly or indirectly. With applications with which high temperatures must be measured, such as for example in rapid heating systems, pyrometers are mainly used. Considered as detectors for pyrometers which are used in this field are, for example, bolometers, pyroelectrical sensors, temperature-dependent resistors (e.g. thermopiles) or photoelectrical detectors. Pyrometers convert the detected radiation directly or indirectly into an electrical measuring signal, and in most cases have the further advantage that they can react sufficiently quickly to changes in the thermal radiation emitted by the substrate to be treated during the thermal process. Depending on the area of application, pyrometers can be used in environments with very low and also with very high radiation density, and so determine the temperature of objects in ranges of between one Kelvin and several thousand Kelvin.

When using pyrometers in rapid heating systems, in general the pyrometer not only receives the self radiation of the substrate to be treated thermally at which it is directed however, but also direct and indirect (reflected and multiply reflected) radiation portions from the substrate environment which are emitted, for example, by the elements heating the substrate (lamps, lasers, resistor heating elements etc.) and the radiation from adjacent objects. It is therefore a challenge to extract the portion of the thermal radiation actually emitted by the substrate from the overall signal hitting the pyrometer in order to determine the substrate temperature from this portion.

Numerous methods for contact-free determination of the temperature of substrates, such as for example wafers, during a thermal process are known from the literature. Although many of these methods are predominantly used for determining the temperature of a semiconductor wafer in a rapid heating installation, they can also be transferred to determining the temperature of objects in ovens.

A method for contact-free temperature determination is disclosed, for example, in the patents of the Applicant U.S. Pat. No. 6,191,392 and U.S. Pat. No. 6,396,363. With this contact-free temperature measurement a first pyrometer is provided which is directed onto one side of the wafer in order to collect the radiation coming from the wafer. This radiation contains both the heat radiation of the wafer itself, and also the radiation from the radiation sources reflected on the wafer. If the wafer is transparent or at least semi-transparent for the selected radiation range, it can also contain portions of the radiation from the radiation sources measured during transmission through the wafer. Furthermore, a second pyrometer is provided which is directed directly towards the radiation sources in order to collect the radiation emitted from the radiation sources. In order to be able to distinguish the self radiation of the wafer from the direct or reflected radiation, or the radiation passing through the wafer, the lamp radiation is modulated. This makes it possible for the radiation source portion which the first pyrometer detects, for example, due to a reflection on the wafer, to be determined and to be subtracted from the overall radiation detected.

The modulation of the radiation sources is chosen here such that it can be measured in the radiation from the radiation sources reflected on the wafer or passing through the wafer, but is not reflected in a modulation of the self radiation of the wafer due to the thermal inactivity of the wafer. With this method, by means of a particular algorithm, the lamp radiation measured on the second pyrometer can be determined and be subtracted from the overall radiation measured on the first pyrometer so that in this way the self radiation of the wafer can substantially be established from the overall signal. From the remaining self radiation, the temperature of the wafer can then be determined. The above method is also known as the ripple technique.

The advantage of the ripple technique is that it is substantially independent of the optical properties of the wafer because it determines the self radiation of the wafer independently of the optical properties of the latter. With very dynamic heating processes the technique touches on its limits, however, and in general short-term deviations between the actual temperature of a wafer and the temperature determined can occur. These deviations can in turn lead to false control of the heating elements which is implemented upon the basis of the determined temperature. With sudden changes to the optical properties of the wafer, as occur for example with recrystallisation process, this sudden change can also have a negative impact upon correct temperature determination in the short term, and this in turn can lead to false control of the heating elements.

With an alternative method measurement of the lamp radiation by means of a second pyrometer, as described above, is replaced by a model which, for example, calculates the resulting modulated lamp radiation upon the basis of the respective control performance of the heating elements. If for example one has very good knowledge of the properties of the processing chamber and of the heating elements and the properties of the wafer to be heated, a mathematical model for in-situ determination of the temperature of the wafer to be heated can be developed. With a sufficiently accurate model of the substrate and its environment, it is possible to calculate lamp background radiation by means of, for example, the control parameters of the heating elements in order to thus determine the substrate temperature directly from the detected heat radiation (i.e. from the sum of the detected self radiation of the wafer and the detected lamp background radiation). The lamp background radiation is to be understood here as meaning all of the radiation detected by the radiation detector less the self radiation of the object of which the temperature is to be determined.

The Applicant's WO 2004/059271 discloses a model-based method (model method) for determining at least one state variable (for example the temperature of a semiconductor wafer) from a model of an RTP system by means of at least one measuring signal picked up on an RTP system which has a dependency upon the state variable to be determined and by means of a corresponding prediction value of the model.

The quality of the model predictions depends upon how precisely they are described by reality. Therefore, all parameter values and boundary conditions having an effect upon the model should be sufficiently precisely known or it should at least be possible to determine them sufficiently precisely. Therefore, models for rapid heating systems include at least the properties of the substrate to be heated (such as e.g. its physical parameters), so that they are capable of producing "response functions" to thermal stimulations in a way that is to a certain extent true to life. On the other hand however, chamber and lamp properties, such as for example chamber reflectivity, lamp radiation, lamp reaction times, the lamp response to electrical impulses, effects of the lamp background radiation etc. have an effect upon the thermal stimulation of the substrate to be heated. These determine the thermal energy actually having an effect upon the wafer and the energy which the wafer can release as self radiation back to its environment per unit of time. These values can only be influenced by the energy which can be introduced to and be discharged from the overall system per unit of time. Since, however, these parameters co-determine the response function of the substrate to be heated, a complete model must also record these parameters i.e. contain at least one model of the substrate environment.

For reasons relating to the real-time requirement, but also because not all required parameters can be determined sufficiently precisely, in general complete model descriptions can not be produced, and this is why the system models used are always reduced models which are limited to a reduced number of more or less precisely determinable state variables. Often, it is also only possible to model part systems and the missing aspects must in many cases be made up for by a corresponding number of partially intricate measurements, and if appropriate be corrected, mostly not all of the required values of the direct measurement being accessible. Therefore, a sufficiently precise measurement of the lamp background radiation having an effect upon the object to be heated for example is very complex because additional measuring means, for example further pyrometers, are required in order to determine this precisely in order to gain precise knowledge of, among other things, the properties of the rear side of the wafer. In the previously used model systems the lamp background radiation is therefore calculated.

If one presumes that the initial state of a real system and the initial state of a system model representing this system are exactly the same, and if one further presumes that the system model exactly replicates the dynamic characteristics of the real system and that no noises or disturbances have any effect upon the real system, the states of the real system and of the system model illustrating this system will always develop in the same way with the same control values. Since, however, the system model only contains partial aspects of the overall system, it must be completed by a control which, if appropriate, takes into account any disturbances that occur. Therefore, with the aforementioned WO 2004/059271 initial variables (measurements) for a closed loop control system (real system) are compared with those of a system model (observer), and differences between them retroact by means of a regulator upon the state of the observer. By means of this state correction, the state of the system model is adapted to the real system, or in other words, the adjustment value for adaptation of the system model is established by an algorithm which compares a recorded measurement value for an object in the rapid heating installation with a prediction value for the measurement value of the object, and is intended to minimise the difference between these two values. In most cases this method makes it possible to determine the thermal characteristics of a wafer very precisely during its thermal treatment.

If, however, the disturbances show unexpected dynamic characteristics which overextend the algorithms typically used, errors can arise due to model misinterpretations. Such cases can occur in particular with very dynamic rapid heating processes and/or if the wafers have a very high level of reflectivity. They can also occur, for example, if an optical property, such as for example reflectivity, suddenly changes during the thermal treatment of the wafer, as was observed e.g. with recrystallisation processes during a thermal treatment. A precise model prediction is of course made particularly difficult if these processes occur in combination, if for example a very dynamic rapid heating process takes place with a wafer with a high level of reflectivity. One reason for this is that these processes are generally not taken into account in system models because they occur sporadically, and also not with all processed wafers. A further reason is a time delay which comes about because the currently measured signals which generally have a lot of noise, are smoothed in filters for the purpose of high signal precision in order to average statistical fluctuations which occur between measurements following one another directly over time. The value determined for the lamp background radiation (lamp radiation coming directly and indirectly into the pyrometer), which is not measured independently of the substrate radiation, can therefore be associated, at least in the short term, with an error relevant to the temperature measurement. This can lead to erroneous temperature determination because, for example, parts at least of the lamp background radiation are assigned to the self radiation of the wafer. The result of this is that the parameter values of the model are; wrongly corrected, and this in turn leads to faulty reactions of the overall system, such as for example an oscillation of the radiation sources because the overall system now tries to readjust the temperature of the wafer determined in this way. Subsequent measuring errors caused by this can lead to erroneous temperature determination over many individual measuring steps, and so lead to instability of the whole system control.

Moreover, the above system is problematic with highly reflective (for example metal-coated) wafers. With these wafers a change to the lamp background radiation dominates very strongly in relation to a change to the self radiation of the wafer. Small errors when determining the lamp background radiation lead to large errors when determining the self radiation (and so the temperature) of the wafer because the differential signal from the overall radiation and the subtracted lamp background radiation is very small. An error which may possibly already be present in the wafer temperature can lead to further destabilisation of the adjustment algorithm upon the basis of high lamp dynamics.

If with a highly reflective wafer the reflectivity changes abruptly during a thermal treatment cycle, the resulting pyrometric measuring signal can be considerably misinterpreted by the evaluation unit (erroneous changes in the reflectivity measurement values are interpreted as a change to the wafer emissivity), and an unrealistic temperature is determined. These abrupt changes can be caused, for example, by phase transformations in applied layers, evaporation or also alloy formations, and are generally not taken into account in model systems because these results can be different from wafer to wafer depending on the coating of the rear side of the wafer, and therefore do not occur predictably. Although the system generally recognises the change in reflectivity over time and correspondingly incorporates this into the temperature determination, it can meanwhile lead to unstable operation of the system with substantial fluctuations as regards the lamp radiation.

If thermal processing steps are provided in a temperature range in which the semiconductor substrate to be processed is almost transparent for thermal radiation, the same problem occurs as with a highly reflective wafer: If the portion of lamp background radiation transmitted by the wafer compared with the thermal radiation of the wafer is very high, small changes to the lamp radiation lead to large relative changes when determining the thermal self radiation of the wafer if the measuring system detects the sum of the very small self radiation of the wafer and the transmission signal of the lamp radiation. Relative measuring errors when establishing the overall signal increase the relative error when determining the self radiation of the wafer which is formed by the difference formed from two values of approximately the same size, namely from the overall signal and the lamp background signal. In this case too precise direct pyrometric measurement of the self radiation of the wafer is made difficult.

Therefore, the object which forms the basis of the present invention is to provide a method and an apparatus for determining measurement values of a measuring system which relate to at least one parameter of an object in a rapid heating apparatus which guarantees reliable determination of the measurement values independently of dynamic process management or sudden changes within the rapid heating installation. In particular, precise temperature determination of an object in the rapid heating apparatus is to be guaranteed, even with highly dynamic processes and with abrupt changes to the optical properties of the object.

In particular the present invention provides a method for determining measurement values which relate to at least one parameter of an object in a rapid heating system. With the method the measurement values are determined by means of at least one measurement measured over time in a measuring system and prediction values for the measurement values in at least one model system are calculated. Furthermore, the method has the following steps: calculating a measurement value by means of the at least one measurement which was recorded at a first point in time, calculating a first prediction value for the measurement value at the first point in time, calculating a second measurement value by means of the at least one measurement which was recorded at a second point in time, calculating a second prediction value for the measurement value at the second point in time, comparing the development over time between the first and second measurement value with the development over time between the first and second prediction value, establishing a corrected second measurement value if the development over time between the first and second measurement value differs from the development over time between the first and second prediction value, and issuing the corrected second measurement value from the measuring system.

By means of the above method, a development over time between actual measurement values and prediction values for these measurement values can be compared by means of which errors, which occur within the measuring system, can be identified and corrected. Even if the prediction values of the model system can not precisely indicate the (absolute) measurement values, they can indicate sufficiently precisely how the measurement values develop over time. Also, should the situation arise where the absolute values differ more greatly, a difference in the respective development over time between the measured and prediction values would point to an "error" in the measuring system which it is appropriate to correct. In relation to the thermal treatment of semiconductor wafers, a sudden change in the reflectivity of the wafer could for example first of all result in incorrect calculation of the wafer temperature because the measuring system relates this change in reflectivity and, if applicable, the associated greater amount of radiation to which the pyrometer is subjected to, to a corresponding abrupt temperature change. Only after a certain time would the measuring system recognise that the sudden change in the amount of radiation to which the pyrometer is subjected to, is not dependent upon a corresponding temperature change, and would, for example, undertake a corresponding correction by means of the ripple technique. In order, however, to avoid an incorrect temperature reading meanwhile, which can in turn influence the control characteristics of the overall system, the method described above can correct excessively great changes to the measurement values which are caused by a false interpretation of their cause by means of the prediction values of the model system.

According to one particularly preferred embodiment of the invention, the corrected second measurement value is only established if the difference in the development over time between the first and second measurement value and the development over time between the first and second prediction value exceeds a pre-determined value so as to only undertake a correction if there are substantial differences. Negligible deviations could rather indicate that the model system can not totally precisely replicate the circumstances within the rapid heating system.

Preferably, the measuring system uses as a measurement an output signal from a radiation detector which records temperature radiation from an object located within the rapid heating system because the above system is suitable in particular for temperature radiation measurements and so for related parameters. Here, the calculated measurement value is preferably a value for the temperature, radiation, emissivity, transmissivity and/or the reflectivity of the object. For example, the measuring system can calculate the measurement value independently of the emissivity of the object. An example of measurement value determination independent of the emissivity is for example temperature determination by means of the "ripple technique" described above or a model-based technique, as described in WO 2004/059271 A, which in this respect is incorporated herein by reference.

Preferably, the temperature radiation from the object located within the rapid heating system is recorded during the thermal heating process of a semiconductor wafer located within the rapid heating system because the above system is particularly suitable for controlling the temperature of a semiconductor wafer in a rapid heating system.

With one embodiment of the invention, in order to correct the second measurement value, the latter is replaced by the second prediction value. With an alternative embodiment a corrected second measurement value is calculated by means of the first measurement value and a relationship between the first and second prediction values. With a further alternative embodiment, the corrected second measurement value is calculated by means of the first and second measurement values and the first and second prediction values. Here, the second measurement value is preferably calculated by means of the formula $$f_{t2}^* = f_{t1} + f_{t2} \times \left(1 - \frac{g_{t1}}{g_{t2}}\right),$$

$f_{t2}^*$ representing the corrected measurement, $f_{t1}$ the first measurement value, $f_{t2}$ the second measurement value, $g_{t1}$ the first prediction value, and $g_{t2}$ the second prediction value.

In order to provide corresponding correction over the process, further measurement values and prediction values can be repeatedly calculated, it being possible for a previously corrected measurement value to form the basis for a subsequent comparison in so far as a correction is implemented.

According to one particularly preferred embodiment of the invention, the model system has at least one model of a semiconductor wafer and/or a model of a processing chamber of the rapid heating system and/or at least one model value for the reflectivity of the object. Here, the model system preferably calculates the value of the background radiation surrounding the object. Furthermore, the model system preferably has at least a first and/or a second changeable model value so as to be able to adapt the model system, if appropriate, during a process. Here, the first changeable model value is preferably changed if the absolute value of the difference between the second measurement value of the measuring system and the second prediction value of the model system is smaller than a pre-specified value. On the other hand, the second changeable model value is preferably changed if the absolute value of the difference between the second measurement of the measuring system and the second prediction value of the model system is greater than or equal to a pre-specified value. Here, it is preferably the second changeable model value which influences the model value for the reflectivity of the object. If the reflectivity of the object changes abruptly, this should also be taken into account within the model system, and this is possible by means of a corresponding model value change. Alternatively and/or in addition, the second changeable model value could influence a model value for the background radiation surrounding the object, by means of which in turn adaptation of the model system to, for example, a change in reflectivity of the object is possible.

With one preferred embodiment of the invention the model system calculates the prediction value for the temperature radiation recorded by the detector. Here the first changeable model value preferably depends functionally upon the prediction value of the temperature radiation calculated for the measuring system. With small deviations therefore, by means of a corresponding change to the first changeable model value adaptation of the model system to actual measurements can be implemented.

The object forming the basis of the invention is also fulfilled by a method for determining the temperature of an object in a rapid heating system with at least one measuring system which records as the measurement at least one temperature radiation from an object located in the rapid heating system and determines a temperature measurement value by means of the measurement, the temperature measurement being selectively correctable by means of a correction method as described above.

The object specified above is fulfilled furthermore by an apparatus for establishing at least one measurement value which relates to a parameter of an object in a rapid heating system, the apparatus having at least one measuring system for recording measurements of the object following on from one another over time and for determining measurement values from the measurements, at least one model system of the rapid heating system which calculates prediction values for the measurement value dependently upon time, means for comparing development over time of the measurement values with the development over time of the prediction values, and means for correcting the measurement values if the development over time between two measurement values differs from the development over time between two prediction values. This type of apparatus makes it possible to carry out the aforementioned method with the corresponding advantages.

In the following, the present invention is described in greater detail by means of preferred embodiments with reference to the drawings. The drawings show as follows.

BRIEF DESCRIPTION OF THE DRAWINGS

DETAILED DESCRIPTION

Figure 1:
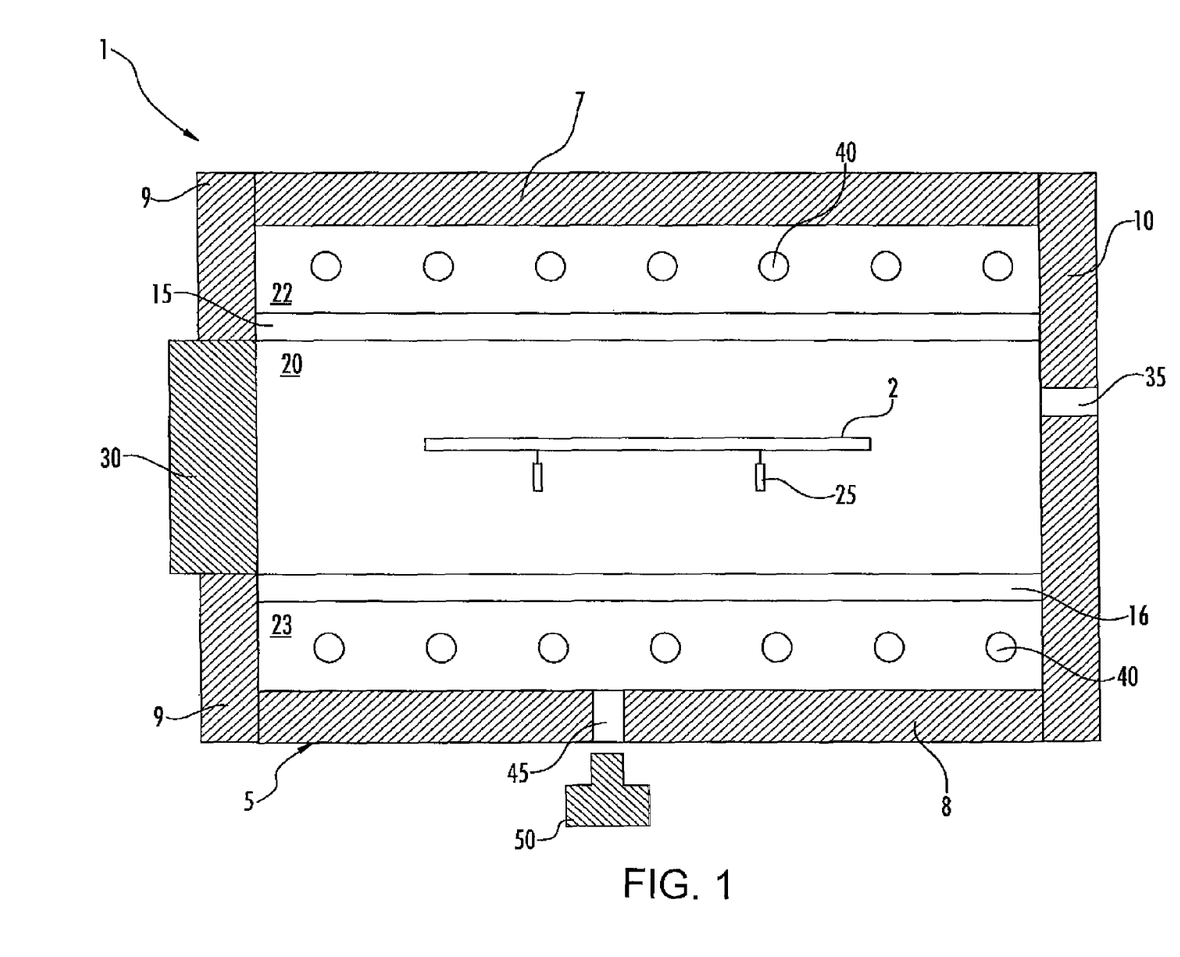
FIG. 1 a schematic sectional view of a rapid heating installation which can be used in combination with the method or the apparatus according to the invention.

FIG. 1 shows a schematic sectional view of a rapid heating apparatus (RTP system) 1 for the thermal treatment of an object 2, such as for example a semiconductor wafer. The rapid heating apparatus 1 has a housing 5 with upper and lower wall elements 7,8 and side wall elements (side walls) 9,10 (in FIG. 1 only left and right side walls are shown, although of course front and rear side walls are also provided). The wall elements form an internal space, and the surfaces of the wall elements facing into the internal space are reflective in design.

The internal space of the housing 5 is divided by transparent elements (e.g. quartz plates) 15, 16 into a processing chamber 20 and upper and lower lamp chambers 22, 23. In the processing chamber 20 an object holding apparatus is provided in the form of support pins 25, which are also called pins. In the one side wall 9 of the housing 5, in the region of the processing chamber 20, a door opening is provided which can be opened or closed by a door 30 in order to enable loading and unloading of the object 2. In the opposite side wall 10 a gas inlet 35 leading into the processing chamber 20 is provided which makes it possible for gas to be passed into the processing chamber 20.

In the upper and lower lamp chambers 22, 23 heating lamps (e.g. halogen lamps) 40 are provided. The transparent elements 15, 16 are substantially permeable for the radiation emitted by the heating lamps 40 and provide gas-tight separation of the lamp chambers 22, 23 from the processing chamber 22. In the lower wall 8 of the housing 5 an opening 45 is provided which makes it possible to lead off part of the heat radiation from the rapid heating installation 1. Adjacent to the opening 45 a radiation detector (e.g. a pyrometer) 50 is provided in order to record heat radiation which has led off.

Operation of the rapid heating installation is described as follows. After loading the processing chamber 20 with an object 2 to be treated, the heating lamps 40 are switched on in order to emit radiation energy. Part of the radiation energy passes through the transparent elements 15, 16 and directly hits the object 2 to be heated. Another part is first of all reflected once or several times on the reflective surfaces of the wall elements 7, 8, 9 and 10, and having passed at least once through at least one of the transparent elements 15, 16 hits the object 2 to be heated. A small part of the radiation is absorbed each time it passes through a transparent element 15, 16. The radiation hitting the object 2 to be heated is partially absorbed, partially reflected, and can partially pass through the object 2 to be heated. The portion of radiation which is absorbed heats the object 2 and ensures that the latter emits radiation itself according to its temperature (self radiation of the object).

The radiation detector 50 receives radiation led off through the opening 45 which contains both self radiation of the object and direct and indirect (i.e. reflected once or several times) lamp radiation. The radiation detector generates an electrical signal upon the basis of the radiation received from which the temperature of the object 2 to be heated can be determined and a control circuit for controlling the heating lamps can be made available.

Figure 2:
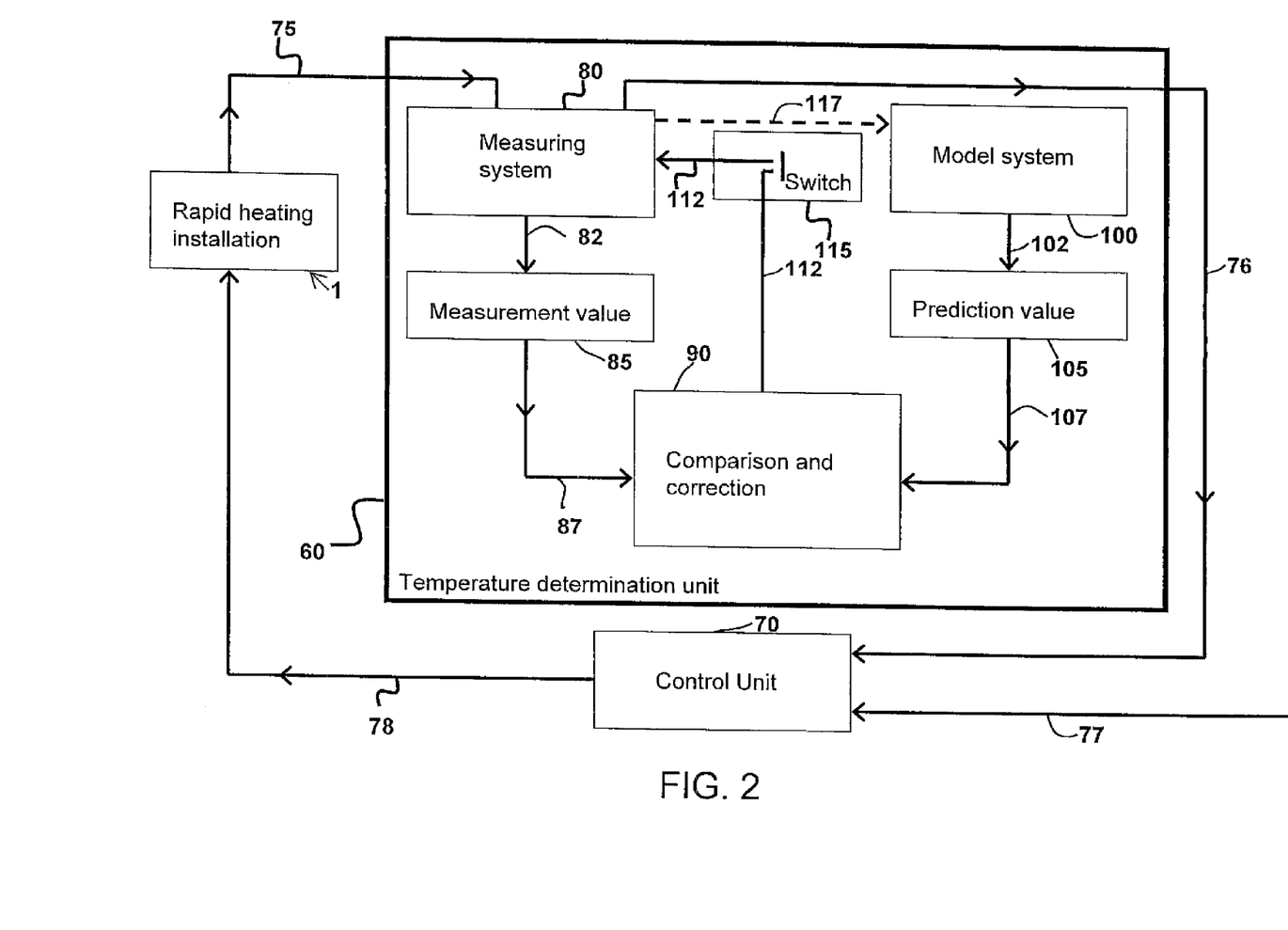
FIG. 2 a block diagram of the apparatus according to the invention in the form of a temperature determination apparatus for temperature control in a rapid heating installation.

FIG. 2 shows a block diagram of a control circuit for temperature control in a rapid heating installation, such as for example the rapid heating installation 1 according to FIG. 1. FIG. 2 shows a block 1 for a rapid heating installation, a block 60 for determining temperature (hereinafter referred to as the temperature determination unit), and a block 70 for a control unit for controlling the heating lamps of the rapid heating installation. A signal output from the radiation detector 50 of the rapid heating installation 1 is connected by a signal line 75 to the temperature determination unit 60. A signal line 76 is a connection between the temperature determination unit 60 and the control unit 70 in order to transfer an actual temperature established in the temperature determination unit 60 to the control unit 70. By means of a further signal line 77 a desired temperature is made available to the control unit 70. By means of a signal line 78 the control unit 70 controls the heating lamps of the rapid heating apparatus.

The temperature determination unit 60 has a block 80 (hereinafter referred to as the measuring system) which is connected to the signal line 75. In the measuring system 80 a temperature signal for the current temperature of the object 2 is established from the output signal from the pyrometer 50 of the rapid heating installation 1, it being possible for this to be established, for example, by means of the ripple technique described at the start (a second pyrometer, and if appropriate a corresponding signal line must then be made available), or the model method. The measuring system 80 is also connected to the signal line 76 by means of which the temperature established for the object 2 can be issued as the actual temperature.

By means of a signal line 82 the block is connected to a measurement value block 85 which serves to receive measurement values from the measuring system 80. In this case measurement values can be, for example, the output signals of the pyrometer 50, the temperature of the object determined in the block 80, or values connected to this, in the following description the temperature of the object established in block 80 being considered as the measurement value. The measurement value block 85 is connected by a signal line 87 to a comparison and correction block 90 (hereinafter referred to as the correction unit) the function of which will be described in greater detail in the following.

The temperature determination unit 60 has, furthermore, a model block 100 (hereinafter referred to as the model system) in which prediction values for the measurement values received in the measurement value block 85 (in the present case the temperature established for the object) are calculated. More precisely, the model system 100 contains a model for the rapid heating apparatus and the object to be heated. By means of the models and from control values for the heating lamps which are made available to the model system 100 by means of a signal line (not shown), corresponding prediction values for the temperature of the object to be heated are calculated as a function of time.

The model system 100 is connected by means of a signal line 102 to a prediction value block 105 in which the calculated prediction values are received. The prediction value block 105 is connected by means of a further signal line 107 to the correction unit 90. The correction unit 90 is connected by means of a signal line 112 to the temperature determination unit 60, the signal line passing through a switch block 115 which can open or close the signal line 112.

Furthermore, a signal line 117 is provided which connects the measuring system 80 to the model system 100. Since this connection is not imperative for the invention, it is shown by dashed lines.

In the following the operation of the closed loop control circuit shown in FIG. 2 with the temperature determination unit 60 according to the invention is described in greater detail.

An object to be treated is received in the rapid heating installation 1 and is heated by the heating lamps 40 of the rapid heating apparatus 1 which are controlled by the control unit 70. The pyrometer 50 of the rapid heating apparatus receives heat radiation led off from the internal space of the rapid heating apparatus and generates a corresponding, time-dependent output signal (pyrometer signal). The pyrometer signal is entered in the measuring system 80 of the temperature determination unit 60 by means of the signal line 75. By means of the pyrometer signal a measurement value is established in the measuring system 80 (in the case described, a temperature for the object 2 in the rapid heating installation 1). A first measurement f(t1) is established here in the measuring system 80 at a first point in time t1 and a second measurement f(t2) at a second point in time t2, and these measurements are then conveyed to the measurement value block 85.

At the same time the model system 100 calculates a first prediction value g(t1) for the point in time t1 and a second prediction value g(t2) for the second point in time t2 and conveys these values to the prediction values block 105. The measurements f(t1) and f(t2) and the prediction values g(t1) and g(t2) are then conveyed to the correction unit 90. In the correction unit 90 the development over time of the measurement values f(t1), f(t2) between the points in time t1 and t2 are substantially compared with the development over time of the prediction values g(t1), g(t2) between the points in time t1 and t2. If there is a deviation with regard to the development over time, a corrected value f*(t2) or a correction value h(f, g) is determined for the second measurement value f(t2), as described in greater detail in the following. A corrected value f*(t2) or a correction value h(f, g) can be determined with each deviation of the development over time between measurements value f(t1), f(t2) and prediction values g(t1), g(t2) or only if these lie over a specific threshold value or between two threshold values.

The corrected value f*(t2) or the correction value h(f, g) are then transferred by the signal line 112 to the measuring system in which the second measurement value f(t2) is replaced by the corrected value f*(t2) or is corrected by means of the correction value h(f, g). If the measurement values show the temperature $T_{actual}$ of the object 2 in the rapid heating installation, only the second measurement value f(t2) (in corrected form if a correction was necessary, or in uncorrected form if no correction was necessary) can now be issued as the actual temperature $T_{actual}$(t2) to the control unit. If the measurement values do not show the temperature $T_{actual}$ of the object 2 in the rapid heating installation, this can be determined in the measuring system 80 by means of the second measurement value f(t2) (in corrected form if a correction was necessary, or in uncorrected form if no correction was necessary), and then be issued as the actual temperature $T_{actual}$(t2) to the control unit. Here the actual temperature $T_{actual}$(t2) is then compared with a corresponding desired temperature value $T_{desired}$(t2) for the point in time t2, and a corresponding control for the heating lamps is determined according to which the latter are then controlled.

A corrected second measurement value f(t2), if applicable, is furthermore transferred to the measurement value block 85 in order to replace the original second measurement value. A third measurement value f(t3) determined in the measuring system 80 at a third point in time t3 is transferred to the measurement value block 85 and then conveyed to the correction unit 90. Here a comparison takes place once again between the development over time between the second and third measurements value f(t2), f(t3) and corresponding prediction values g(t2), g(t3) and if appropriate determination of a corrected third measurement value f*(t3) or of a correction value for this is established which is passed on to the measuring system 80. The above process is then iterative for further measurement values which are determined at further points in time t4, t5 . . . tn and corresponding prediction values are repeated.

By means of the switch block 115 the inventive process can however also be switched on or off by means of externally specifiable conditions: If it is known, therefore, for example, that the wafers to be thermally processed can include those with which at a critical temperature Tc sudden changes to reflectivity can occur, e.g. a first temperature T1<Tc can be specified (externally for example) with which, when reached, the process according to the invention is switched on by means of the switch block 115. In addition, a second temperature T2>Tc can be pre-specified with which, when reached, the process according to the invention is switched off again by means of block 115.

In the following determination of a correction value h(f, g) and of a corrected second measurement value f*(t2) is described in greater detail.

On the condition that the values f(t1), f(t2), g(t1) and g(t2) are greater than zero, the correction value h(f,g) can, for example, be calculated as follows:

$$h=(g(t2)-g(t1))/g(t2)-(f(t2)-f(t1))/f(t2) \quad (1)$$

By means of a transformation f*(t2)=f(t2, h), for example $$f(t2,h)=f(t2)*(1+h) \quad (2)$$

being set, the measurement value f(t2) established at the point in time t2 is corrected to a value f*(t2). If one inserts equation 1 into equation 2, this gives:

$$f*(t2)=f(t1)+f(t2)*(1-g(t1)/g(t2)) \quad (3)$$

This functional connection shows that f*(t2) is always equal to f(t1) when the expected prediction values g(t1) and g(t2) are also the same. If the relationship between the established values f(t1)/f(t2) is equal to the relationship between the prediction values g(t1)/g(t2), this gives: f*(t2)=f(t2) and no correction is made to the measurement f(t2).

A rearrangement of equation 3 finally gives:

$$(f*(t2)-g(t2))=(f(t2)-g(t2))*(1-g(t1)/g(t2)) \text{ for all } f(t1)=g(t1) \quad (4)$$

With corresponding measurements value f(t1) and prediction values g(t1), if the measurement value f(t2) and the prediction value g(t2) are different, the corrected measurement value f*(t2) is always between f(t2) and g(t2), provided g(t2) is greater than g(t1)/2. With sufficiently small temporal steps between t1 and t2 this condition can always be fulfilled. The above determination can of course be used correspondingly for further pairs of measurement values f(ti),f(ti+1) and corresponding pairs of prediction values g(ti), g(ti+1).

An alternative method for determining the correction value f*(t2) can use, for example, weighted values of f(t1) and f(t2). If, for example, a and b are two pre-specified non-negative constants, and if at least one of the two constants is positive, then in order to determine f*(t2) the following function can also be chosen:

$$f*(t2)=f(t1)+[(a/(a+b))*f(t2)+(b/(a+b))*f(t1)]*[1-g(t1)/g(t2)] \quad (5)$$

Without limiting the inventive idea, a and b could however also be time-dependent weighting functions, the values of which can be calculated as a function of the chosen points in time t1 and t2.

A simple relationship of f*(t2)=f(t1)*g(t2)/g(t1) or others will be available to the person skilled in the art for determining a corrected measurement, and so the present invention is not limited to the specific formulae, although formula (3) is a preferred embodiment of the invention.

By using appropriate correction functions, one can succeed in coupling the measured values more strongly to the calculated model values so that unexpected abrupt changes in the radiation measured can be attributed to a previously unobserved part of the overall radiation which was previously presumed to be faultless, and so do not lead to calculation of erroneous temperatures in the measuring system.

If these abrupt changes occur in the measured radiation during a thermal process, with model systems with several parameters they can be attributed more reliably to the correct cause or the correct parameter. Therefore, with highly reflective wafers, unexpected changes to the radiation measured can, for example, be attributed to a sudden change in the reflectivity of the wafer. With very rapid heating processes (e.g. with spike annealing), unexpected changes to the radiation measured can be attributed to an error in the lamp background radiation which can arise due to the time offset between the filtered current measurement and the model prediction value of the model system adapted to earlier measurements. Depending on the process chosen and the wafer type, with rapid heating systems therefore the correct conclusions can be drawn from sudden changes in the radiation measured and these changes can be attributed to the correct parameters of the model system.

Figure 3:
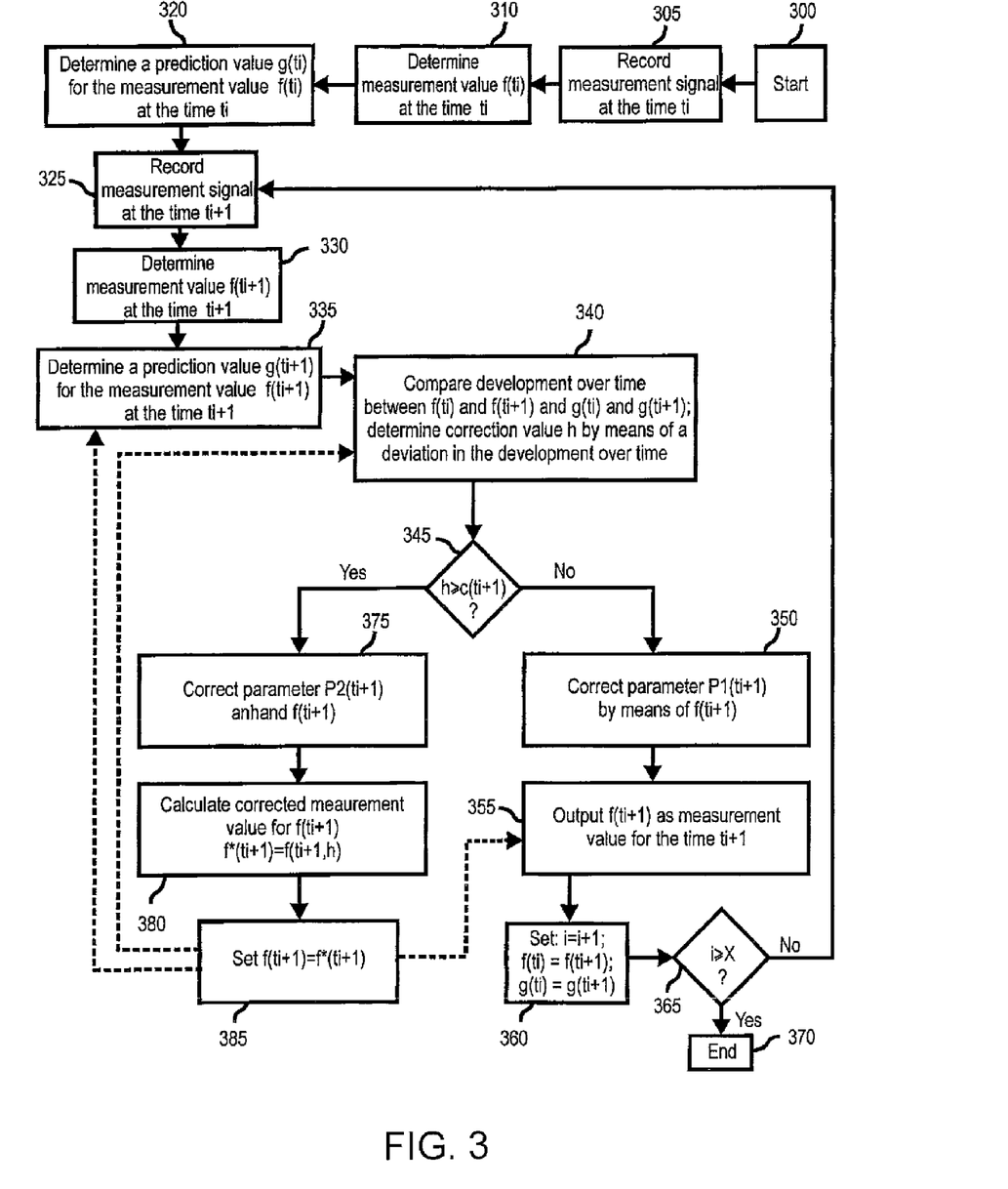
FIG. 3 a flow chart which shows a model correction process.

With appropriate attribution, therefore, a change can also be made to the model system 100, it being possible to convey the relevant information from the measuring system 80 for example by means of the signal line 117. In order to illustrate this functional principle FIG. 3 shows a flow chart which describes a correction method, as described above, for the measurements and describes a corresponding model correction, the system according to FIG. 2 forming the basis.

The process starts with step 300, the process start-up possibly being conditional upon a corresponding trigger signal. In step 305 at the point in time ti the value of a time-dependent measuring signal is recorded. The time-dependent measuring signal can for example be the output signal of the pyrometer 50 according to FIG. 2. In step 310 a measurement value f(ti) is established from the measuring signal (for example by entering the measurement value in the measuring system 80 and by correspondingly determining a measurement value therein). The measurement value can be, for example, the radiation measurement value of a detected radiation signal or a temperature measurement value determined from the measuring signal for any object in an RTP system towards which the temperature sensor providing the measuring signal is directed at the point in time ti. Preferably, the measurements value represent the heat radiation measured by a pyrometric detector and which is made up from the sum of the radiation emitted by a wafer and the lamp background radiation.

In step 320, for the point in time ti a prediction value g(ti) corresponding to the measurement value f(ti) is calculated by means of a model (for example by means of model system 100). Included in the calculation is, for example, a model of the object to be heated, therefore e.g. a wafer model and/or a model of the rapid heating apparatus and/or the current control values for the heating lamps. The prediction value is therefore, for example, a prediction value calculated in the model system 100 which is calculated from the overall radiation made up of the wafer radiation and the lamp background radiation which is detected on the pyrometer 50.

Now, in step 325, at the point in time ti+1 a further value for the time-dependent measuring signal is recorded. From this further measuring signal in step 330 a further measurement value f(ti+1) is established in the way described above. Next, in step 335 a prediction value g(ti+1) corresponding to the measurement value f(ti+1) is established for the point in time ti+1 by means of the model described above.

In step 340 the development over time between measurements value f(ti) and f(ti+1) on the one hand and prediction values g(ti) and g(ti+1) on the other hand is established and compared. If there is a deviation with regard to the development over time, a correction value h is established by means of this deviation in the development over time. This is established, for example, in the correction block 90 according to FIG. 2.

In step 345 this correction value h is then compared with a value c(ti+1). The value c(ti+1) is for example a time-dependent threshold value at the point in time ti+1. Alternatively, however, a fixed threshold value can also be provided. The threshold value represents, for example, a pre-specified temperature or radiation value. It can be a pre-specified constant or a variable by means of which, for example, the maximum and minimum differences between the developments over time of the measurements value and the development over time of the prediction values are defined. The threshold value forms a decision criterion for whether a correction to the measurement value and, if applicable, a correction to the model system should be implemented or not. If it is established in step 345 that the value c(ti+1) is smaller than h, the process control then passes to step 350.

In step 350 a parameter P1(ti+1) of the model for the prediction values is corrected by means of the measurement value f(ti+1). If the correction value h is smaller than the threshold value c(ti+1), this indicates that the deviation in the development over time between the measurements value and the prediction values is relatively small and are attributable, for example, to small, sudden changes within the processing chamber of an RTP system. This type of sudden change can be, for example, a sudden change with regard to the reflectivity of a thermally treated object such as, for example a semiconductor wafer. If there is only a small deviation in the development over time between measurement values and prediction values, one presumes that the model system is not totally precise, and so with small deviations in the development over time between measurement values and prediction values a correction is made to a parameter P1(ti+1). The parameter P1(ti+1) can be a value variable over time, as shown by the addition ti+1. P1(ti+1) can, for example, be a radiation value prediction by the model which is given by the sum of wafer radiation and lamp background radiation in an RTP system according to FIG. 2 when the radiation from the wafer or from another object located in the RTP system is measured with a pyrometer. In general the parameter P1 can be considered to be a changeable model value which is functionally dependent upon the prediction value of the calculated temperature radiation of a measuring system.

Following the correction of the parameter P1(ti+1) in step 350 the process control passes to step 355. In step 355 the measurement value f(ti+1) is issued for the point in time ti+1, i.e. the measurement value is issued without any further correction and is used, for example, for temperature control as an actual value.

Next, the control passes to step 360 where the value i is increased by one, the value one representing a particular interval of time. Furthermore, in step 360 the value of f(ti) is set equal to the value of f(ti+1), and the value of g(ti) is set equal to the value of g(ti+1).

Next, in step 365 it is checked whether the value i is greater than a value X which represents, for example, a threshold value which signals the end of a thermal treatment. If i is greater than X, the process control then passes to step 370 and the process routine is ended.

If i is smaller than X, the process control then returns to step 325 where a further measuring signal is recorded at the point in time ti+1, the point in time ti+1 corresponding to the point in time ti+2 because the value i has been increased by one.

Next, the process control again follows the pre-specified path, it being notable that with the comparison in step 340, the values of f(ti) and g(ti) as lower values for establishing the development over time correspond to the values f(ti+1) and g(ti+1) of the previous cycle. Therefore, a comparison is now made between the development over time of the respective values between the points in time ti+1 and ti+2.

If it was established in step 345 above that the correction value h is greater than or equal to the value c(ti+1), the process control then passes to step 375 rather than to step 350. In step 375 a parameter P2(ti+1) is corrected by means of f(ti+1). If the correction value h is greater than the value c(ti+1), this then indicates, for example, that an unforeseen sudden change has occurred when recording the measuring signal. This can, for example, be caused by a sudden change in the reflectivity of a wafer, as described above. In order to make it possible, for calculating the prediction values, for the model to adapt to this type of sudden change in reflectivity, the parameter P2(ti+1) is therefore corrected by means of f(ti+1). Here the value P2(ti+1) represents, for example, a value of the reflectivity of a wafer at the point in time ti+1. The parameter P2(ti+1) can, for example, also be a correction parameter which calculates a model correction by means of the state values of a model system at different times, or a parameter from which the value of the lamp background radiation can be calculated.

Following the correction of the parameter P2(ti+1) the process control passes to step 380. In step 380 a corrected measurement value f*(ti+1) is calculated from f(ti+1) and h, (f*(ti+1)=f(ti+1, h)). This calculation can be implemented, for example, in the way previously described with reference to FIG. 2.

Next, the process control passes to step 385 where the value of f(ti+1) is replaced by the corrected value f*(ti+1).

Next, the process control passes either to step 355 or to step 340, by means of which different options are provided for the further course of the process. The process control can be designed so that it basically only provides one process procedure or both process procedures in parallel as options, from which one can be selected. Here, the selection can for example be determined in advance by an operator for a respective process. It is also conceivable for decision logic to be provided in the process which decides, for example, by means of the correction parameter or further information, whether one should pass to step 355 or to step 340.

In step 355 f(ti+1) would be issued directly (with the corrected value of f*(ti+1)) as a measurement value for the point in time ti+1, and the process control would then follow the process procedure already described above.

In step 340 the development over time between the measurements f(ti) and f(ti+1) on the one hand and the prediction values g(ti) and g(ti+1) on the other hand would be established and compared once again, wherein during this comparison f(ti+1) has the corrected value of f*(ti+1). Next, the further process procedure already described above would be followed once again. The variation finally specified makes it possible to check whether the corrected measurement provides a sufficient correction, and whether this value would sufficiently correspond to the model. If this is the case, in step 345 h<c(ti+1) so that the process control would pass via step 350 to step 355 and would issue f(ti+1) in the corrected form here.

As a further alternative, it would also be possible to pass from step 385 to step 335, where first of all a new prediction value g(ti+1) would be determined taking into account the corrected parameter P2(ti+1), and this would then be used for the comparison in step 340. This would not only provide checking of the corrected measurement f(ti+1), but also of the corrected parameter P2(ti+1). In order to prevent the process control from hanging in a loop consisting of steps 340, 345, 375, 380, 385, (335), 340, an appropriate logic could be provided so that this loop will only be run through Y times for a specific value of i, Y standing for a integer, such as for example 1, 2 or 3. Upon reaching this number of cycles for the above loop for a specific value i, in step 385 the process control would automatically choose the option of step 355.

In the following, a further, small variation of the flow chart according to FIG. 3 is described. If wafers were to be located, for example, among a number of wafers with known properties and provided with a layer, which with a known temperature Tk undergo a crystallisation process, h could, for example, correspond to the currently measured or the currently calculated temperature T. The value c(ti+1) could be a first externally pre-specifiable threshold value temperature T1 which is smaller than Tk and a value d(ti) could be a second externally pre-specifiable threshold value temperature T2 which is greater than Tk. The query in step 340 could now be: Does T lie between T1 and T2 (d(ti+1)≧h≧c(ti+1)). The process control would then continue as shown in FIG. 3.

Figure 4:
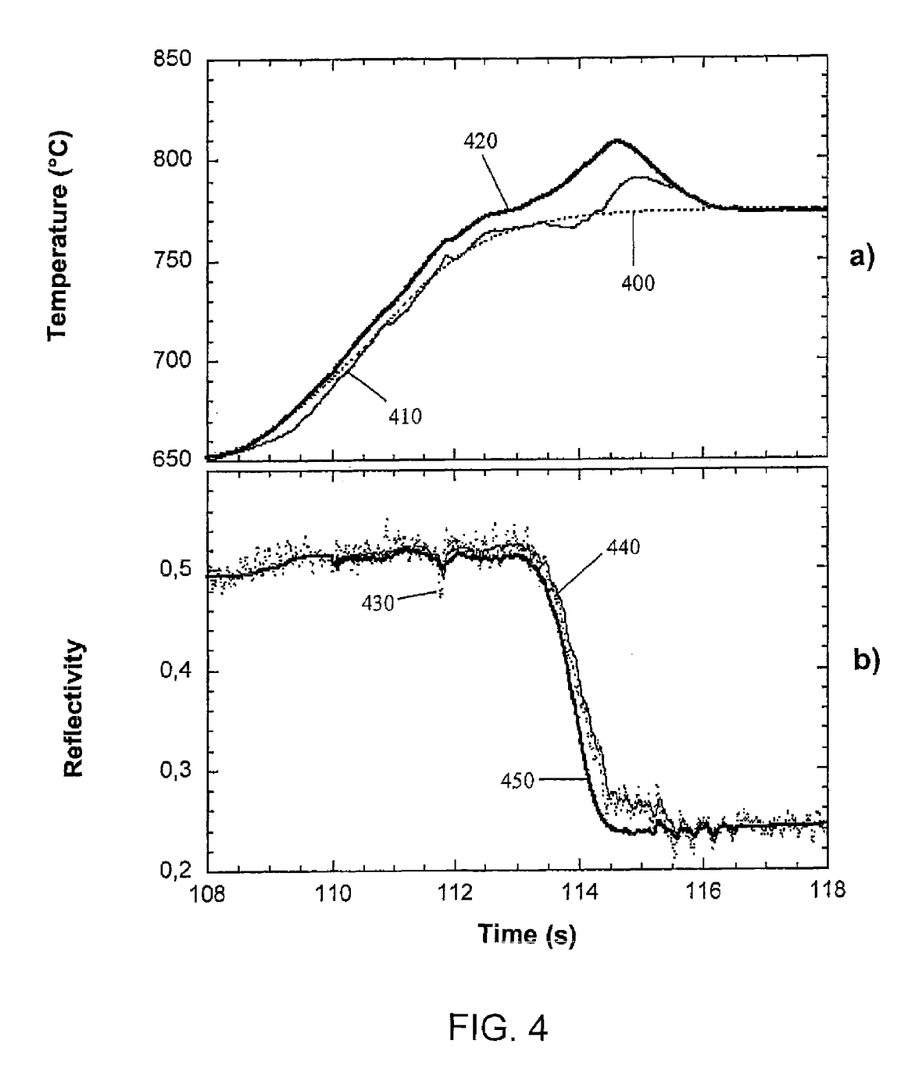
FIG. 4a temperature/time curves of a wafer the reflectivity of which changes during thermal treatment.
FIG. 4b reflectivity/time curves of a wafer the reflectivity of which changes during thermal treatment.

FIG. 4a shows temperature/time curves and FIG. 4b shows reflectivity/time curves of a wafer the reflectivity of which changes in a rapid heating installation during a thermal treatment. In FIG. 4a the temperature development of the wafer is plotted against time. The curve 400 shows the desired temperature in degrees Celsius according to which temperature control is implemented. The curve 410 shows the temperature determined for the wafer as a function of time using a conventional temperature determination method. The curve 420 shows the temperature determined for the wafer as a function of time using the temperature determination method according to the invention.

In FIG. 4b the reflectivity of the wafer associated with this process is plotted dependently upon time. The curve 430 shows the raw data values determined for the reflectivity of the wafer as a function of time during the heating process. The curve 440 shows the reflectivity of the wafer during the heating process with which the conventional temperature determination method was used, and the curve 450 shows the reflectivity of the wafer during the heating process with which the temperature determination method according to the invention was used.

In relation to the raw data 430 the curve 440 appears in the flank of the curve, temporally offset to the right. The reason for this is that the curve 440 shows the development of the raw data after flattening by filters. Since the raw data 430 already measured for this purpose are averaged over a number of measurement values preceding the last measurement, value the resulting filter curve 440 shifts to the right in relation to the raw data. In relation to this, in curve 450 the calculated reflectivity appears offset to the left in relation to the raw data.

In FIG. 4a the example shows that when using the temperature determination method according to the invention, the temperature curve 420 determined shows a development corresponding better to reality than the temperature curve 410. The curve 410 shows a drop in temperature during the change in the reflectivity of the wafer, and in addition only reacts temporally after the change in reflectivity of the wafer with an increase in temperature. This drop in temperature does not occur in reality, however, and is attributable to the fact that with the conventional temperature determination method, The change in reflectivity leads to temporarily incorrect temperature determination. With both curves, in the later development, the temperature determined corresponds to the desired temperature (curve 400). Curve 420 reproduces the actual temperature development of the wafer more realistically than curve 410 because there is no drop in temperature during the heating phase.

Figure 5:
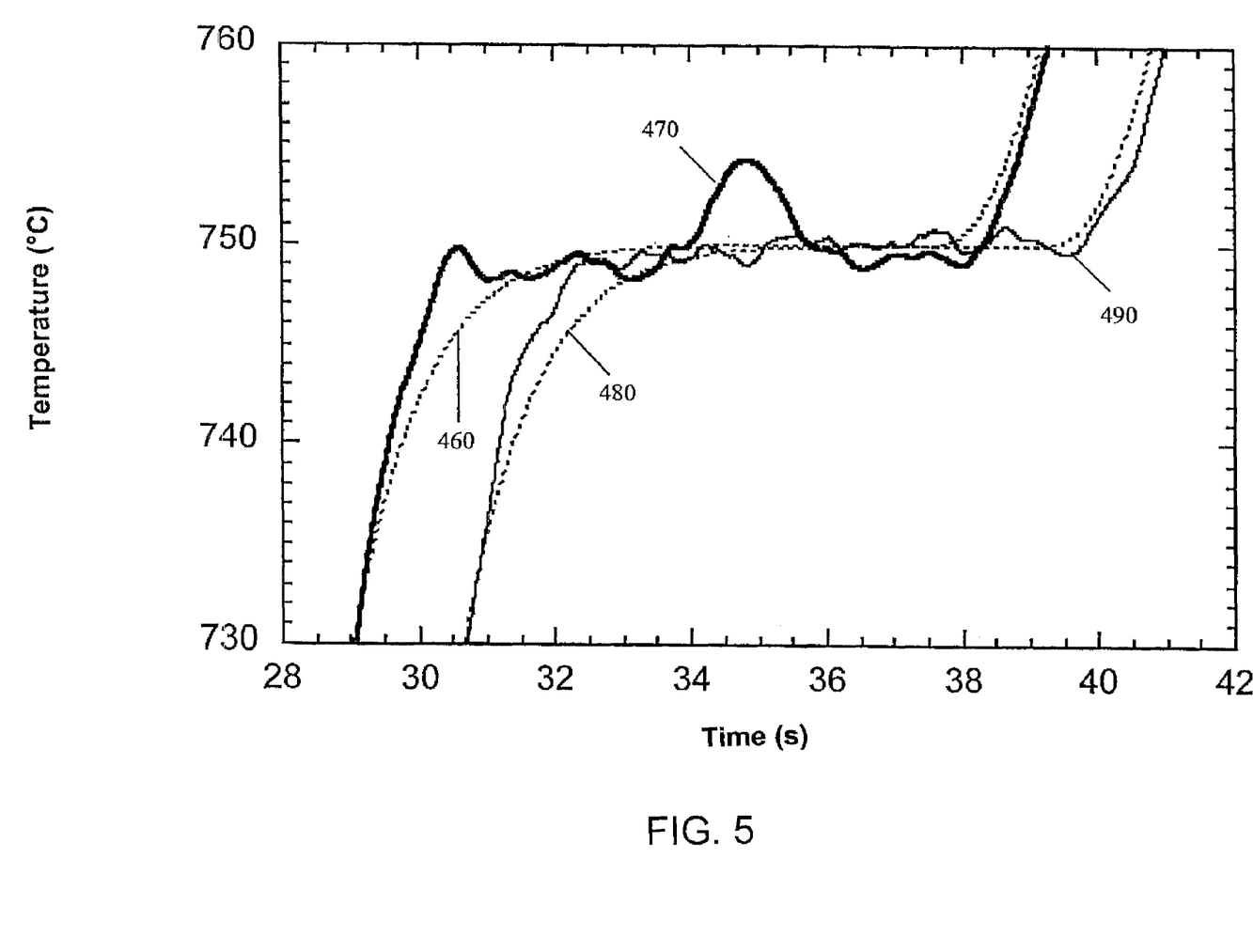
FIG. 5 temperature/time curves of a wafer during thermal treatment, one curve showing the temperature of the wafer during conventional thermal treatment, and one curve showing the temperature during treatment which uses a temperature determining method of the present invention.

FIG. 5 shows temperature/time curves of a wafer during its thermal treatment, the wafer undergoing a change in reflectivity during the thermal treatment. Here, the curve 460 shows the development of the desired temperature of the wafer during thermal treatment. The curve 470 shows the corresponding actual development of the temperature of the wafer during thermal treatment, the temperature being controlled upon the basis of a conventional temperature determination method. The curve 480 shows the same development of a desired temperature as curve 460 with a temporal offset. The curve 490 shows the corresponding actual development of the temperature during thermal treatment, the temperature being controlled upon the basis of a temperature determination method according to the invention.

By means of the curves the effect of the method according to the invention upon temperature control during thermal treatment with a wafer which undergoes a change in reflectivity during the thermal treatment can be illustrated. A comparison of the two pairs of curves clearly shows that without using the temperature determination method according to the invention, high control fluctuations occur in the thermal plateau which when using the temperature determination method according to the invention do not occur. This can be explained in that with the temperature determination method according to the invention measurements are corrected when the development over time of the latter deviates from the development over time of prediction values calculated by a model system. In this way parameter changes, such as e.g. the change in reflectivity described above, are prevented from having an erroneous influence upon determination of the measurement values (e.g. the temperature).

Although the invention has been described by means of preferred embodiments, it is not restricted to the embodiments specifically illustrated. In particular, it is not restricted to the direct temperature determination of an object to be treated. For example, with the system described above, the pyrometer can also be directed towards an item other than the object to be treated (e.g. towards a hotliner lying adjacent to the object) in order to establish the temperature of said item, which in turn allows one to deduce the temperature of the object to be treated. Other parameters of the object or of another item can also be determined. In particular, it is also not necessary for the prediction values to be respectively precisely calculated for the points in time at which the respective measurement values are recorded. The prediction values must only be sufficiently close in time to the respective points in time of the measurement recording. The prediction values could therefore also be calculated for points in time which lie between consecutive relevant recorded measurements.

The invention also includes embodiments which arise from combining and/or changing round the features of the described embodiments. The method according to the invention can also be used with systems for determining temperatures of an object to be thermally processed other than those mentioned above.

What is claimed is:

1. A method for determining measurement values which relate to at least one parameter of an object in a rapid heating system with which the measurement values are determined by means of at least one measurement measured over time in a measuring system, and with which prediction values for the measurement values are calculated in at least one model system, the method having the following steps:

a) calculating a first measurement value ($f_{r1}$) by means of the at least one measurement which was recorded at a first point in time (t1) by the measuring system;
b) calculating a first prediction value ($g_{r1}$) for the measurement value at the first point in time (t1) by the model system,
c) calculating a second measurement value ($f_{r2}$) by means of the at least one measurement which was recorded at a second point in time (t2) by the measuring system;
d) calculating a second prediction value ($g_{r2}$) for the measurement value at the second point in time (t2) by the model system;
e) comparing the development over time between the first and second measurement value ($f_{r1}$, $f_{r2}$) with the development over time between the first and second prediction value ($g_{r1}$, $g_{r2}$) by a correction unit;
f) determining a corrected second measurement value ($f^*_{r2}$) by the correction unit if the development over time between the first and the second measurement value ($f_{r1}$, $f_{r2}$) differs from the development over time between the first and second prediction value ($g_{r1}$, $g_{r2}$); and
g) issuing the corrected second measurement value ($f^*_{r2}$) from the measuring system.

2. The method according to claim 1, characterised in that a corrected second measurement determining ($f^*_{r2}$) is only determined if the difference in the development over time between the first and second measurement value ($f_{r1}$, $f_{r2}$) and the development over time between the first and second prediction value ($g_{r1}$, $g_{r2}$) exceeds a predetermined value.

3. The method according to claim 2, characterised in that the temperature radiation from the object located within the rapid heating system is recorded during the thermal heating process of a semiconductor wafer located within the rapid heating system.

4. The method according to claim 1, characterised in that the measuring system uses as a measurement an output signal from a radiation detector which records temperature radiation from an object located within the rapid heating system.

5. The method according to claim 4, characterised in that the measuring system calculates the measurement value independently of the emissivity of the object.

6. The method according to claim 4, characterised in that the model system contains at least one model value for the reflectivity of the object.

7. The method according to claim 6, characterised in that the second changeable model value influences the model value for the reflectivity of the object.

8. The method according to claim 4, characterised in that the model system calculates the value of the background radiation surrounding the object.

9. The method according to claim 8, characterised in that the second changeable model value influences the model value for the background radiation surrounding the object.

10. The method according to claim 4, characterised in that the model system calculates the prediction value for the temperature radiation recorded by the detector.

11. The method according to claim 4, the object being a semiconductor wafer, a hotliner or a container enclosing a semiconductor wafer.

12. The method according to claim 4, the object being made at least partially of quartz.

13. The method according to claim 4, the object being at least a heating element of the rapid heating installation.

14. The method according to claim 13, the heating element being a halogen lamp, an arc lamp or a laser.

15. The method according to claim 13, the heating element being a resistance heating element.

16. The method according to claim 1, characterised in that the calculated measurement value is a value for the temperature, radiation, emissivity, transmissivity and/or reflectivity of the object.

17. The method according to claim 1, characterised in that in step f) the second measurement value is replaced by the second prediction value.

18. The method according to claim 1, characterised in that in step f) a corrected second measurement value is calculated by means of the first measurement value and a relationship between the first and the second prediction values.

19. The method according to claim 1, characterised in that in step f) a corrected second measurement value is calculated by means of the first and second measurement values and the first and the second prediction values.

20. The method according to claim 19, characterised in that the corrected second measurement value is calculated by means of the following formula:

$$f_{t2}^* = f_{t1} + f_{t2} \times \left(1 - \frac{g_{t1}}{g_{t2}}\right),$$

wherein $f^*_{t2}$ represents the corrected second measurement value, $f_{t1}$ the first measurement value, $f_{t2}$ the second measurement value, $g_{t1}$ the first prediction value and $g_{t2}$ the second prediction value.

21. The method according to claim 1, characterised in that steps c) to f) are repeated for further measurement values ($f_{t3, 4, \ldots n}$) and prediction values ($g_{t3, 4, \ldots n}$), the corrected second measurement value, in so far as a correction has been undertaken, or the second measurement value, in so far as no correction has been undertaken, being taken as the first measurement value and the second prediction value as the first prediction value.

22. The method according to claim 1, characterised in that the model system includes at least one model of a semiconductor wafer.

23. The method according to claim 1, characterised in that the model system includes a model of a processing chamber of the rapid heating system.

24. The method according to claim 1, characterised in that the model system has at least a first changeable model value.

25. The method according to claim 24, characterised in that the model system has at least a second changeable model value.

26. The method according to claim 25, characterised in that the second changeable model is changed if the value of the absolute difference between the second measurement value of the measuring system and the second prediction value of the model system is greater than a pre-specified value.

27. The method according to claim 24, characterised in that the first changeable model value is changed if the absolute value of the difference between the second measurement value of the measuring system and the second prediction value of the model system is smaller than a pre-specified value.

28. The method according to claim 24, characterised in that the first changeable model value depends functionally upon the prediction value of the temperature radiation calculated for the measuring system.

29. A method for determining the temperature of an object in a rapid heating system with at least one measuring system which records as a measurement at least one temperature radiation from an object located in the rapid heating system and determines a temperature measurement value by means of the measurement, the temperature measurement value being selectively correctable by means of a correction method according to claim 1.

30. The method according to claim 29, characterised in that a correction is only made if the temperature measurement value lies above a pre-determined first threshold value.

31. The method according to claim 30, characterised in that a correction is only implemented if the temperature measurement value lies above a predetermined second threshold value which is higher than the predetermined first threshold value.

32. The method according to claim 30, characterised in that a correction is not implemented if the prediction value of the model system lies above a predetermined second threshold value which is higher than the predetermined first threshold value.

33. The method according to claim 30, characterised in that a correction is only implemented if the reflectivity of the object changes by a value which is higher than a pre-specified value.

34. The method according to claim 30, characterised in that a correction is only implemented if a measured and/or calculated relationship between the temperature radiation of the object and a temperature radiation recorded overall exceeds a pre-specified value.

35. An method according to claim 29, characterised in that a correction is only implemented if a prediction value of the model system lies above a predetermined first threshold value.

36. An apparatus for determining at least one measurement value which relates to a parameter of an object in a rapid heating system (1), the apparatus having the following:
   at least one measuring system for recording measurements of the object following one another over time and for determining measurement values from the measurements;
   at least one model system of the rapid heating system which calculates prediction values for the measurement values dependently upon time;
   means for comparing development over time of the measurement values with the development over time of the prediction values; and
   means for correcting the measurement values if the development over time between two measurement values ($f_{t1}$, $f_{t2}$) differs from the development over time between two corresponding prediction values ($g_{t1}$, $g_{t2}$).

* * * * *